United States Patent
Shuto

(10) Patent No.: US 10,522,483 B2
(45) Date of Patent: Dec. 31, 2019

(54) PACKAGE ASSEMBLY FOR EMBEDDED DIE AND ASSOCIATED TECHNIQUES AND CONFIGURATIONS

(71) Applicant: Intel Corporation, Santa Clara, CA (US)

(72) Inventor: Takashi Shuto, Kouyadai (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/380,529

(22) Filed: Apr. 10, 2019

(65) Prior Publication Data

US 2019/0237413 A1 Aug. 1, 2019

Related U.S. Application Data

(62) Division of application No. 16/012,016, filed on Jun. 19, 2018, now Pat. No. 10,304,785, which is a
(Continued)

(51) Int. Cl.
*H01L 25/11* (2006.01)
*H01L 23/31* (2006.01)
(Continued)

(52) U.S. Cl.
CPC ............ *H01L 23/562* (2013.01); *H01L 24/19* (2013.01); *H01L 25/117* (2013.01); *H01L 25/18* (2013.01);
(Continued)

(58) Field of Classification Search
CPC ..... H01L 23/562; H01L 24/19; H01L 25/117; H01L 25/18; H01L 25/50; H01L 21/568;
(Continued)

(56) References Cited

U.S. PATENT DOCUMENTS

| 5,847,327 | A | | 12/1998 | Fischer et al. |
| 6,093,970 | A | * | 7/2000 | Ohsawa ................. H01L 23/24 257/777 |

(Continued)

FOREIGN PATENT DOCUMENTS

| CN | 1449031 A | 10/2003 |
| CN | 101043010 A | 9/2007 |

(Continued)

OTHER PUBLICATIONS

Notice of Preliminary Rejection dated Jun. 8, 2015, issued in corresponding Korean Patent Application No. 10-2014-0075061, 18 pages.

(Continued)

*Primary Examiner* — Didarul A Mazumder
(74) *Attorney, Agent, or Firm* — Schwabe, Williamson & Wyatt, P.C.

(57) ABSTRACT

Embodiments of the present disclosure are directed towards a package assembly for embedded die and associated techniques and configurations. In one embodiment, an apparatus includes a package assembly comprising a die attach layer, a die coupled with the die attach layer, the die having an active side including active devices of the die and an inactive side disposed opposite to the active side, a reinforced plate coupled with the die attach layer, the reinforced plate having a first side and a second side disposed opposite to the first side and a cavity disposed in the reinforced plate and one or more build-up layers coupled with the second side of the reinforced plate, the one or more build-up layers including an insulator and conductive features disposed in the insulator, the conductive features being electrically coupled with the die, wherein the inactive side of the die is in direct contact with the die attach layer, the first side of the reinforced plate is in direct contact with the die attach layer
(Continued)

and the die is disposed in the cavity. Other embodiments may be described and/or claimed.

10 Claims, 7 Drawing Sheets

Related U.S. Application Data division of application No. 15/611,428, filed on Jun. 1, 2017, now Pat. No. 10,014,263, which is a division of application No. 13/928,179, filed on Jun. 26, 2013, now Pat. No. 9,685,414.

(51) Int. Cl.
*H01L 23/00* (2006.01)
*H01L 25/18* (2006.01)
*H01L 25/00* (2006.01)
*H01L 21/56* (2006.01)

(52) U.S. Cl.
CPC .......... *H01L 25/50* (2013.01); *H01L 21/568* (2013.01); *H01L 23/3128* (2013.01); *H01L 2224/04105* (2013.01); *H01L 2224/12105* (2013.01); *H01L 2224/16145* (2013.01); *H01L 2224/16225* (2013.01); *H01L 2224/16237* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2225/1023* (2013.01); *H01L 2225/1058* (2013.01); *H01L 2924/00012* (2013.01); *H01L 2924/12042* (2013.01); *H01L 2924/15311* (2013.01); *H01L 2924/15331* (2013.01); *H01L 2924/181* (2013.01); *H01L 2924/351* (2013.01)

(58) Field of Classification Search
CPC ....... H01L 23/3128; H01L 2224/04105; H01L 2224/12105; H01L 2224/16145; H01L 2224/16225; H01L 2224/16237; H01L 2224/32225; H01L 2224/48091; H01L 2224/48227; H01L 2224/73204; H01L 2224/73265; H01L 2224/73267; H01L 2225/1023; H01L 2225/1058; H01L 2924/00012; H01L 2924/12042; H01L 2924/15311; H01L 2924/15331; H01L 2924/181; H01L 2924/351
USPC ........ 257/774; 438/629, 637, 639, 640, 667, 438/668, 672, 675, 700, 701, 713, 978
See application file for complete search history.

(56) References Cited

U.S. PATENT DOCUMENTS

| | | | |
|---|---|---|---|
| 7,842,541 B1 | 11/2010 | Rush et al. | |
| 9,685,414 B2 * | 6/2017 | Shuto | H01L 25/117 |
| 2002/0189853 A1 | 12/2002 | Hsu | |
| 2006/0289733 A1 | 12/2006 | Zung et al. | |
| 2007/0132072 A1 | 6/2007 | Chang | |
| 2007/0232050 A1 | 10/2007 | Toyama et al. | |
| 2009/0072382 A1 | 3/2009 | Guzek et al. | |
| 2010/0140782 A1 * | 6/2010 | Kim | H01L 23/5383 257/690 |
| 2010/0308443 A1 | 12/2010 | Suthiwongsunthorn et al. | |
| 2011/0121445 A1 | 5/2011 | Mori et al. | |
| 2011/0215464 A1 * | 9/2011 | Guzek | H01L 21/568 257/737 |
| 2012/0049366 A1 | 3/2012 | Zeng | |
| 2012/0068319 A1 | 3/2012 | Choi et al. | |
| 2012/0112336 A1 | 5/2012 | Guzek et al. | |
| 2012/0161316 A1 * | 6/2012 | Gonzalez | H01L 21/568 257/738 |
| 2012/0161331 A1 | 6/2012 | Gonzalez et al. | |
| 2012/0235278 A1 | 9/2012 | Shigihara et al. | |
| 2012/0286404 A1 | 11/2012 | Pagaila | |
| 2012/0326337 A1 | 12/2012 | Camacho et al. | |
| 2013/0003319 A1 | 1/2013 | Malatkar et al. | |
| 2013/0032938 A1 | 2/2013 | Lin et al. | |
| 2013/0048361 A1 * | 2/2013 | Yamashita | H01L 23/49822 174/260 |
| 2013/0093078 A1 | 4/2013 | Lin et al. | |
| 2013/0105991 A1 | 5/2013 | Gan et al. | |
| 2013/0285204 A1 | 10/2013 | Saita et al. | |
| 2014/0048949 A1 | 2/2014 | Lin et al. | |
| 2014/0048950 A1 * | 2/2014 | Lin | H01L 23/3121 257/774 |

FOREIGN PATENT DOCUMENTS

| | | | |
|---|---|---|---|
| JP | 2004288711 A | 10/2004 | |
| JP | 2010528491 A | 8/2010 | |

OTHER PUBLICATIONS

Non-Final Office Action dated Jan. 9, 2015 for U.S. Appl. No. 13/928,179, 20 pages.
Final Office Action dated Sep. 1, 2015 for U.S. Appl. No. 13/928,179, 19 pages.
Non-Final Office Action dated Apr. 21, 2016 for U.S. Appl. No. 13/928,179, 20 pages.
Non-Final Office Action dated Oct. 20, 2016 for U.S. Appl. No. 13/928,179, 21 pages.
Notice of Allowance dated Feb. 15, 2017 for U.S. Appl. No. 13/928,179, 8 pages.
Notice of Allowance dated May 12, 2017 for U.S. Appl. No. 13/928,179, 9 pages.
Non-Final Office Action dated Sep. 22, 2017 for U.S. Appl. No. 15/611,428, 23 pages.
Notice of Allowance dated Mar. 7, 2018 for U.S. Appl. No. 15/611,428, 12 pages.
Non-Final Office Action dated Oct. 11, 2018 for U.S. Appl. No. 16/012,016, 16 pages.
Notice of Allowance dated Jun. 19, 2018 for U.S. Appl. No. 16/012,016, 15 pages.

* cited by examiner

PACKAGE ASSEMBLY FOR EMBEDDED DIE AND ASSOCIATED TECHNIQUES AND CONFIGURATIONS

CROSS REFERENCE TO RELATED APPLICATION

This application is a divisional application of U.S. patent application Ser. No. 16/012,016, entitled "PACKAGE ASSEMBLY FOR EMBEDDED DIE AND ASSOCIATED TECHNIQUES AND CONFIGURATIONS", filed Jun. 19, 2018, which is a divisional application of U.S. application Ser. No. 15/611,428, entitled "PACKAGE ASSEMBLY FOR EMBEDDED DIE AND ASSOCIATED TECHNIQUES AND CONFIGURATIONS", filed Jun. 1, 2017, now U.S. Pat. No. 10,014,263, which is a divisional application of U.S. patent. Ser. No. 13/928,179, filed Jun. 26, 2013, entitled "PACKAGE ASSEMBLY FOR EMBEDDED DIE AND ASSOCIATED TECHNIQUES AND CONFIGURATIONS," now U.S. Pat. No. 9,685,414, and claims priority to the Ser. Nos. 16/012,016, 15/611,428 and 13/928, 179 applications. The disclosures of Ser. Nos. 16/012,016, 15/611,428 and 13/928,179 are hereby fully incorporated by reference.

FIELD

Embodiments of the present disclosure generally relate to the field of integrated circuits, and more particularly, to a package assembly for embedded die and associated techniques and configurations.

BACKGROUND

Currently, integrated circuit (IC) package assemblies may include package-on-package (PoP) configurations where a first package substrate is coupled with a second package substrate using an interposer disposed between the first and second package substrate. For example, the first package substrate may be a thin coreless substrate for a processor and the second package substrate may be for a memory component and the first and second package substrate may each be coupled with the interposer using micro solder balls. A resulting PoP structure using the interposer may have a height (e.g., z-height) that limits implementation of the PoP structure in small form factor devices such as, for example, mobile computing devices that continue to shrink to smaller dimensions.

Furthermore, the thin coreless substrate may require a fixture jig to handle the substrate during assembly processes such as solder ball reflow, die attach, and/or interposer attach operations owing to lack of structural rigidity. Using the fixture jig may increase assembly costs and complexity. Additionally, in some cases, a high temperature (e.g., ~260° C.) thermal process may be used to couple the die with the substrate using a solderable material, which may result in thermal stress related defects (e.g., warpage) due to difference in coefficient of thermal expansion (CTE) between the die and the substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
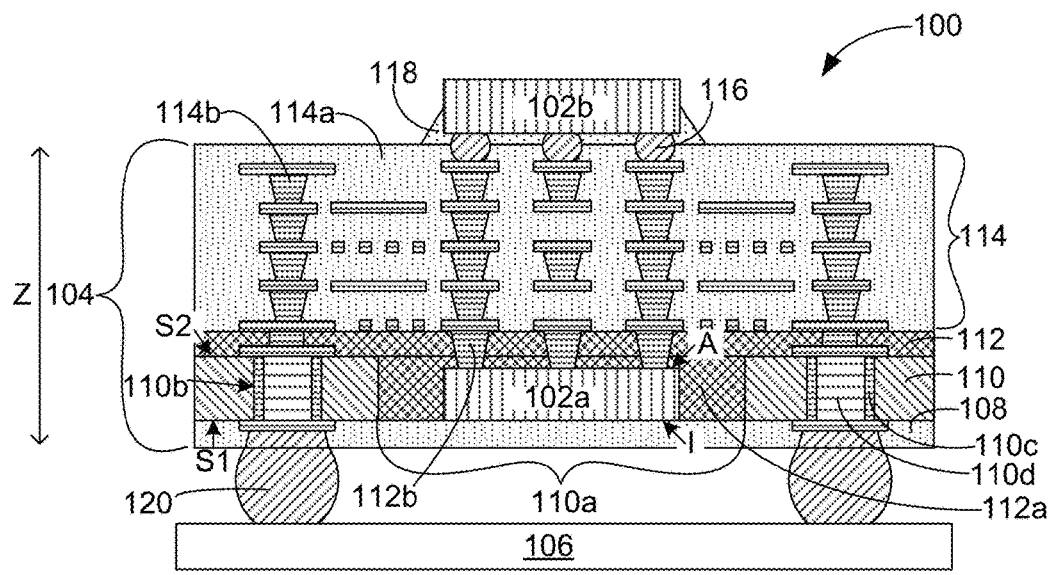
FIG. 1 schematically illustrates a cross-section side view of an example integrated circuit (IC) package assembly, in accordance with some embodiments.

Embodiments of the present disclosure a package assembly for embedded die and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly (hereinafter "package assembly 100"), in accordance with some embodiments. In some embodiments, the package assembly 100 includes a package substrate 104 coupled with one or more dies (e.g., dies 102a, 102b) and a circuit board 106, as can be seen.

In an embodiment, the package assembly 100 may refer to only the package substrate 104. The package substrate 104 may include a die attach layer 108, a reinforced layer (hereinafter "reinforced plate 110"), a laminate layer 112 and one or more build-up layers (hereinafter "build-up layers 114"), coupled as shown.

The package substrate 104 may include a die attach layer 108, which may be used as a substrate for attachment of the die 102a. That is, in some embodiments, the die 102a may be coupled in direct contact with the die attach layer 108. In some embodiments, the die attach layer 108 may be composed of an electrically insulative material such as, for example, an epoxy resin. In some embodiments, the die attach layer 108 may be composed of a same material as an insulator 114a of the build-up layers 114. The die attach layer 108 may be composed of other suitable materials in other embodiments.

The package assembly 100 may include a die 102a coupled with the die attach layer 108 and embedded in the package substrate 104. The die 102a may have an active side, A, including active devices such as, for example, one or more transistor devices and an inactive side, I, disposed opposite to the active side A. In some embodiments, the inactive side I of the die 102a may be in direct contact with the die attach layer 108. The die 102a may be a discrete unit of an IC product made from a semiconductor material using semiconductor fabrication techniques such as thin film deposition, lithography, etching and the like. In some embodiments, the die may be, include, or be a part of a processor, memory, system on chip (SoC) or ASIC in some embodiments. In one embodiment, the die 102a is a processor such as, for example, a central processing unit (CPU). The die 102a may be configured to serve other functions in other embodiments.

The package substrate 104 may further include a reinforced plate 110 coupled with the die attach layer 108. The reinforced plate 110 may include a material that is reinforced relative to material of the die attach layer 108 and/or build-up layers 114. For example, in some embodiments, material of the reinforced plate 110 may have an elastic modulus that is greater than an elastic modulus of material of the die attach layer 108 and/or build-up layers 114 or the reinforced plate may have a thickness that is greater (e.g., to provides greater structural rigidity) than a thickness of the die attach layer 108 and/or individual or multiple layers of the build-up layers.

In some embodiments, the reinforced plate 110 may be composed of an epoxy resin with glass cloth. In other embodiments, the reinforced plate 110 may be composed of a metal (e.g., as described in connection with FIG. 3). The reinforced plate 110 may be composed of other suitable materials in other embodiments. The reinforced plate 110 may strengthen the package substrate 104 for handling and/or assembly associated with fabrication of the build-up layers 114 using, for example bumpless build-up layer (BBUL) techniques. For example, in some embodiments, the reinforced plate 110 may obviate a need for using a fixture jig, which may be used for handling and/or assembly during fabrication of a flexible package substrate.

The reinforced plate 110 may have a first side, S1, and a second side, S2, disposed opposite to the first side S1. In some embodiments, the first side S1 may be in direct contact with the die attach layer 108. The reinforced plate 110 may further have a cavity 110a formed in the reinforced plate 110. In some embodiments, the cavity 110a may pass through the reinforced plate 110 to provide an opening between the first side S1 and the second side S2, as can be seen.

In some embodiments, the die 102a may be disposed in the cavity 110a. The die may have a thickness that is less than a thickness of the reinforced plate 110 as measured from the first side S1 to the second side S2, as can be seen, in some embodiments. Embedding the die 102a in the cavity 110a may reduce a total height (e.g., Z dimension indicated by arrow in FIG. 1) of the package substrate 104 and/or package assembly 100. For example, a separate discrete interposer element may not be needed to couple the package substrate 104 housing the die 102a with the die 102b (e.g., no need for micro-solder ball connections between packages housing respective dies 102a and 102b), which may allow reduction of the package height.

In some embodiments, the reinforced plate 110 may include one or more interconnects configured to electrically couple the first side S1 and the second side S2 of the reinforced plate 110 such as, for example, plated through holes (PTHs) 110b. The PTHs 110b may be configured to route electrical signals of the die 102a (and/or possibly other dies such as die 102b). In some embodiments, the PTHs 110b may include a plated opening 110c composed of an electrically conductive material such as a metal (e.g., copper) filled with a plugging material 110d such as, for example, epoxy resin. The reinforced plate 110 may include other suitable interconnect structures formed through the reinforced plate 110 to route the electrical signals in other embodiments.

The package substrate 104 may further include a laminate layer 112 coupled with the reinforced plate 110 and disposed between the build-up layers 114 and the reinforced plate 110. In some embodiments, the laminate layer 112 may be in direct contact with the second side S2 of the reinforced plate 110. The laminate layer 112 may include prepreg material (e.g., B-stage material) that flows into the cavity 110a to provide a die encapsulant material 112a of the die 102a when subjected to a thermal and/or pressure process (e.g., hot press process). The die encapsulant material 112a may include prepreg material disposed in the cavity 110a and at least partially encapsulating the active side A and/or sidewalls of the die 102a. The die encapsulant material 112a may fill or substantially fill the cavity 110a in some embodiments.

In some embodiments, the prepreg material of the laminate layer 112 and die encapsulant material 112a may include an epoxy resin with glass cloth. The prepreg material may further strengthen and/or reinforce the package substrate 104 for handling and/or assembly associated with fabrication of the build-up layers 114. The material of the laminate layer 112 and die encapsulant material 112a may include other suitable materials in other embodiments.

One or more interconnects may be formed in the laminate layer 112 to electrically couple the die 102a with conductive features 114b (e.g., electrical routing features) of the build-up layers 114. For example, in some embodiments, the interconnects may include via structures 112b that extend through the laminate layer 112 and die encapsulant material 112a to corresponding contacts such as pads on the die 102a. The via structures 112b may be formed using any suitable process including, for example, a laser process to remove material of the laminate layer 112 and die encapsulant material 112a to provide a laser via joint between the die 102a and the build-up layers 114. The laser via joint may have a structure consistent with being formed by a laser process. For example, a profile of the laser via joint may taper as can be seen. The interconnects of the laminate layer 112 may include other suitable interconnect structures in other embodiments.

Using a laser process to form openings in the laminate layer 112 and/or die encapsulate material 112a may be performed at a temperature (e.g., at or near room temperature) that is much lower than a solder reflow temperature. Accordingly, using a laser process to fabricate the laser via joint for first-level interconnect (FLI) between the die 102a and the package substrate 104 may reduce or eliminate thermal related defects (e.g., stress or warpage) that may cause interconnect reliability failures or other FLI defects associated with CTE mismatch between the die 102a and the package substrate 104. For example, defects such as massive solder bump-bridge (MSBB), die misalignment (DM) and non-contact open (NCO) defects associated with using micro-ball interconnects may be reduced and/or eliminated in the package assembly 100.

The package substrate 104 may further include the build-up layers 114 coupled with the first side of reinforced plate 110. In some embodiments, an individual build-up layer of the build-up layers 114 is in direct contact with the laminate layer 112. The build-up layers 114 may include electrical routing features (e.g., hereinafter "conductive features 114b") of individual build-up layers 114 coupled together in an electrically insulative material (hereinafter "insulator 114a"). The conductive features 114b may include, for example, trenches, vias, traces or other suitable routing structures composed of an electrically conductive material such as metal (e.g., copper). The insulator 114a may be composed of an epoxy resin. The conductive features 114b and the insulator 114a may be composed of other suitable materials in other embodiments. In some embodiments, the build-up layers 114 may be formed using Ajinomoto Build-up Film (ABF) techniques. Other suitable techniques to fabricate the build-up layers 114 may be used in other embodiments.

In some embodiments, another die 102b may be coupled with the package substrate 104. For example, in the depicted embodiment, the die 102b is coupled with the build-up layers 114 in a flip-chip configuration using solderable material 116 such as solder bumps to couple corresponding contacts (e.g., pads) on the die 102b with the conductive features 114b of the build-up layers 114. In some embodiments, an underfill material 118 may be disposed between an active side of the die 102b and the package substrate 104. The die 102b may be coupled with the package substrate 104 using other suitable techniques such as, for example, wire-bonding techniques, embedding techniques and the like or other FLI interconnect structures such as pillars to couple the die 102b with the package substrate 104.

According to various embodiments, the first die 102a may be a logic die such as, for example, a processor or ASIC and the second die 102b may be a memory die. The first dies 102a and/or 102b may be configured to perform other functions in other embodiments.

In some embodiments, the conductive features 114b of the build-up layers 114 may be electrically coupled with the dies 102a and/or 102b (e.g., and possibly other dies) and configured to route electrical signals of the dies 102a and/or 102b through the package substrate 104. The electrical signals may include, for example, input/output (I/O signals) and/or power/ground signals associated with operation of the dies 102a, 102b. In some embodiments, the conductive features 114b may route electrical signals between the dies 102a, 102b. In this regard, the dies 102a and 102b may be electrically coupled with one another. In some embodiments, the conductive features 114b may route electrical signals between one or more of the dies 102a, 102b and another electrical component such as, for example, a circuit board 106 by way of interconnects in the laminate layer 112, PTHs 110b and/or package-level interconnects such as solder balls 120.

In some embodiments, one or more package-level interconnects such as, for example, solder balls 120 may be coupled with the package substrate 104 to further route the electrical signals to another electrical component such as circuit board 106. The solder balls 120 may be arranged in a ball-grid array (BGA) configuration in some embodiments. The package-level interconnects may include other suitable structures such as, for example, land-grid array (LGA) structures. The package-level interconnects (e.g., solder balls 120) may be coupled with the PTHs 110b through the die attach layer 108, as can be seen, in some embodiments. In other embodiments, additional build-up layers (not shown) may be formed on the die attach layer 108 to provide additional electrical routing for the package substrate 104 and the package-level interconnects may be coupled with the additional build-up layers.

The package assembly 100 may further include a circuit board 106 coupled with the package substrate 104 through the package-level interconnects (e.g., solder balls 120). Only a small portion of the circuit board 106 may be depicted for the sake of discussion. The package-level interconnects may be coupled with contacts (e.g., pads) of the circuit board 106 to route electrical signals of the dies 102a, 102b between the package substrate 104 and the circuit board 106. The circuit board 106 may be a printed circuit board (PCB) composed of an electrically insulative material such as, for example, an epoxy laminate. For example, the circuit board 106 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Electrical routing structures (not shown) such as traces, trenches, vias, and the like may be formed through the electrically insulating layers to route the electrical signals of the dies 102a, 102b through the circuit board 106. The circuit board 106 may be composed of other suitable materials in other embodiments. In some embodiments, the circuit board 106 is a motherboard (e.g., motherboard 802 of FIG. 8).

The package assembly 100 may include components configured in a wide variety of other suitable configurations in other embodiments including, for example, interposers, multi-chip package configurations including system-in-package (SiP) and/or package-on-package (PoP) configurations to route electrical signals between the dies 102a, 102b and other electrical components in some embodiments.

FIGS. 2a-h schematically illustrate various stages of fabrication of an example IC package assembly (hereinafter "package assembly 200"), in accordance with some embodiments. The package assembly 200 may comport with embodiments described in connection with package assembly 100 and vice versa.

Figure 2A:
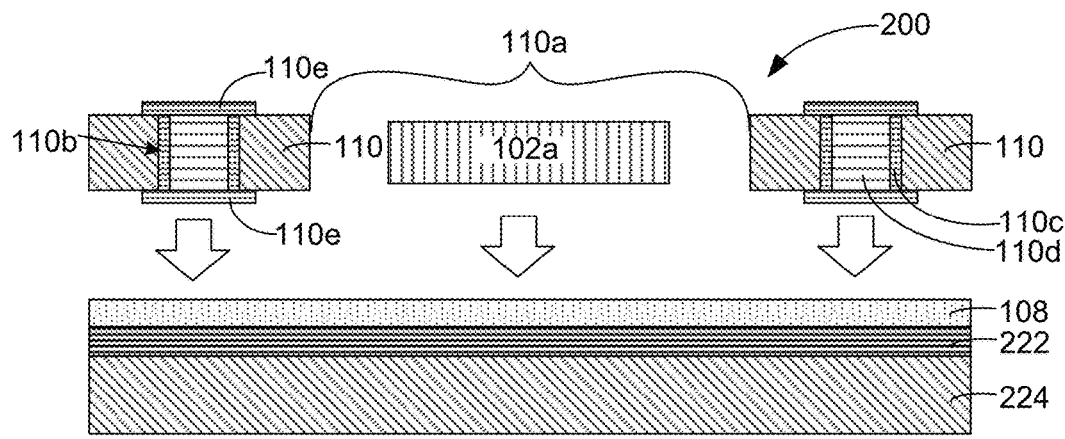
FIGS. 2a-h schematically illustrate various stages of fabrication of an example IC package assembly, in accordance with some embodiments.

FIG. 2a depicts the package assembly 200 subsequent to providing a die attach layer 108 on a dummy panel (hereinafter "panel 224"), which may facilitate handling of the package assembly 200 during fabrication. A peelable core 222, which may be composed of a metal such as, for example, copper, may be disposed on the panel 224 to receive and hold the die attach layer 108. In some embodiments, the die attach layer 108 may include a B-stage resin that is placed on the peelable core 222.

A die 102a and reinforced plate 110 may be placed on the die attach layer 108 as indicated by the downward arrows. Prior to placement on the die attach layer 108, the reinforced plate 110 may be fabricated to include one or more PTHs 110b having a cavity 110a and traces 110e formed on both sides of plated openings 110c that may be filled with a plugging material 110d.

Figure 2B:
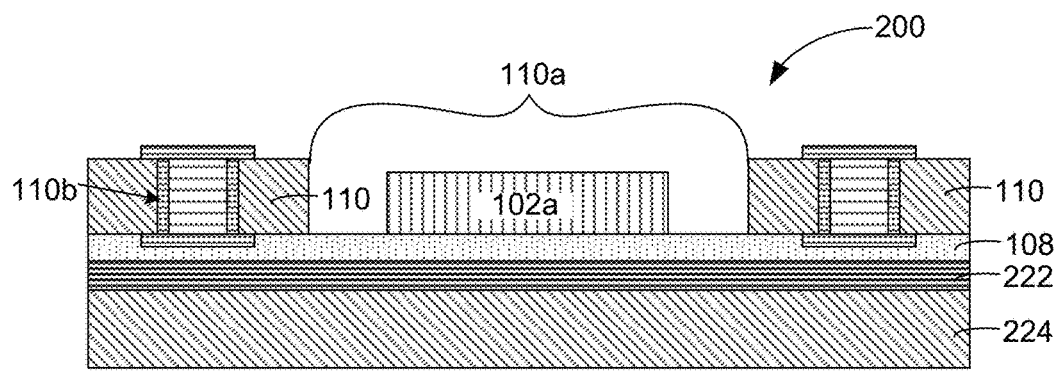

FIG. 2b depicts the package assembly 200 subsequent to coupling the die 102a and the reinforced plate 110 with the die attach layer 108. The die 102a and the reinforced plate 110 may be coupled with the die attach layer 108 using any suitable technique. In some embodiments, a lamination process may be used to couple the die 102a and the reinforced plate 110 with the die attach layer 108. For example, a hot pressing process in a vacuum environment may be used to apply heat and pressure between the die attach layer 108 and the reinforced plate 110 and/or between the die attach layer 108 and the die 102a. In some embodiments, the hot pressing may be followed by a curing process, which may be used to cure the B-stage resin of the die attach layer 108. In some embodiments, the die 102a and the reinforced plate 110 may be coupled with the die attach layer 108 simultaneously (e.g., using a same hot press process and/or curing process).

Figure 2C:
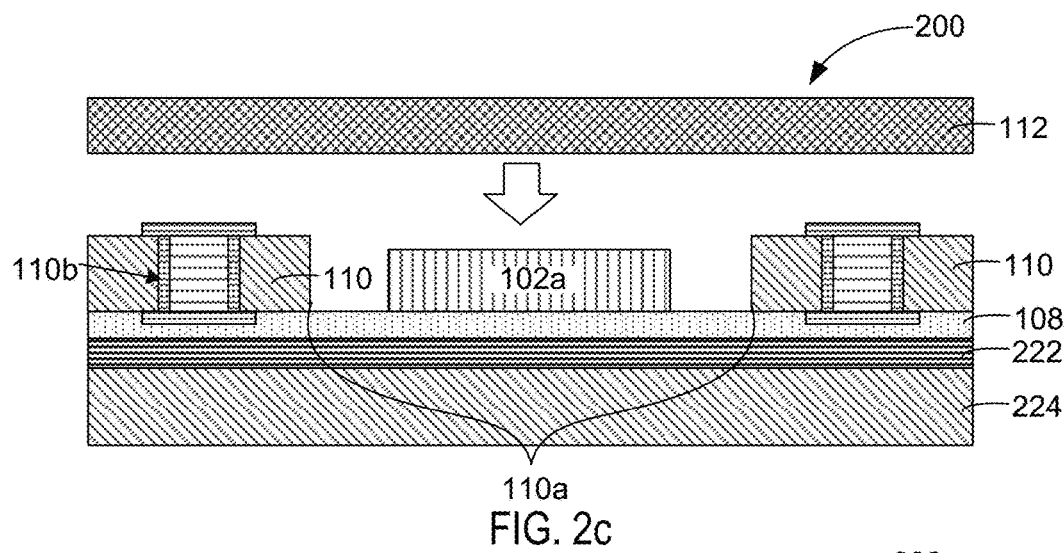
Figure 2D:
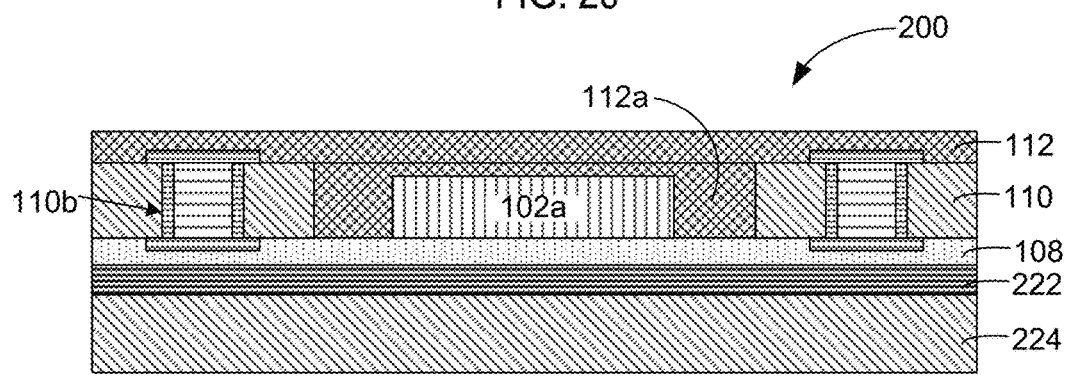

FIG. 2c depicts the package assembly 200 subsequent to providing a laminate layer 112 for placement on the reinforced plate 110 and FIG. 2d depicts the package assembly 200 subsequent to performing a lamination process to couple the laminate layer 112 with the reinforced plate 110 and to fill the cavity 110a with material of the laminate layer 112 to provide die encapsulant material 112a. The laminate layer 112 may be composed of a B-stage prepreg material in some embodiments. In some embodiments, the lamination process includes a hot press process. Other suitable techniques and/or materials may be used in connection with the laminate layer 112 in other embodiments.

Figure 2E:
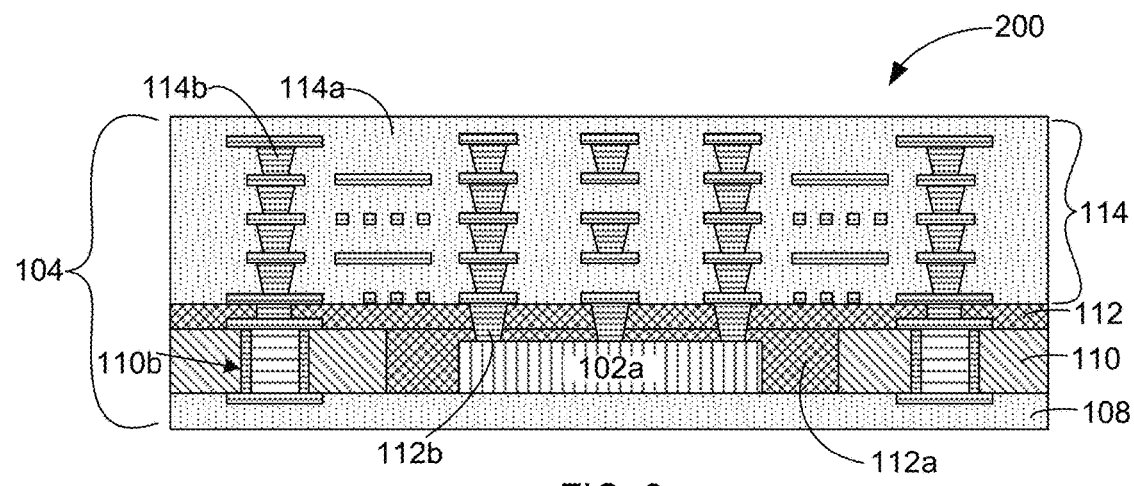

FIG. 2e depicts the package assembly 200 subsequent to forming one or more build-up layers 114 on the laminate layer 112 and decoupling the die attach layer 108 from the panel 224. The build-up layers 114 may be formed using any suitable technique including, for example, laminate processes such as ABF techniques. The peelable core 222 may be removed (e.g., by peeling) from the panel 224. The peelable core 222 may further be removed from the die attach 108 by peeling and/or by etching processes that are selective to removing material of the peelable core 222 relative to the die attach layer 108.

In some embodiments, prior to forming the build-up layers 114, via structures 112b may be formed through material of the laminate layer 112 to provide FLIs for the die 102a. The via structures 112b may be formed using a laser process to remove the material of the laminate layer 112 in some embodiments. The laser process may include a drilling process that is performed using an ambient temperature that is at or around room temperature or less than 100° C.

Figure 2F:
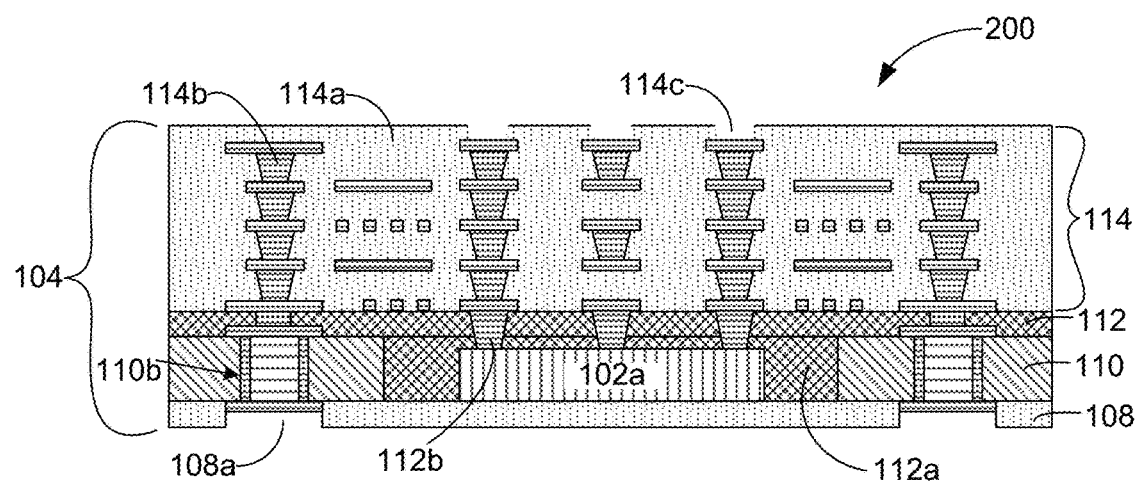

FIG. 2f depicts the package assembly 200 subsequent to forming openings 114c to expose conductive features 114b of the build-up layers 114 and forming openings 108a to expose interconnects (e.g., PTHs 110b) of the reinforced plate 110. The openings 114c and 108a may be formed using any suitable technique including, for example, a laser process to drill away material of the insulator 114a and/or die attach layer 108. A desmesar process may be used to clean surfaces within the openings 114c and/or 108a and a surface finish may be deposited on electrically conductive surfaces in the openings 114c and/or 108a to facilitate formation of joints with the electrically conductive surfaces.

Figure 2G:
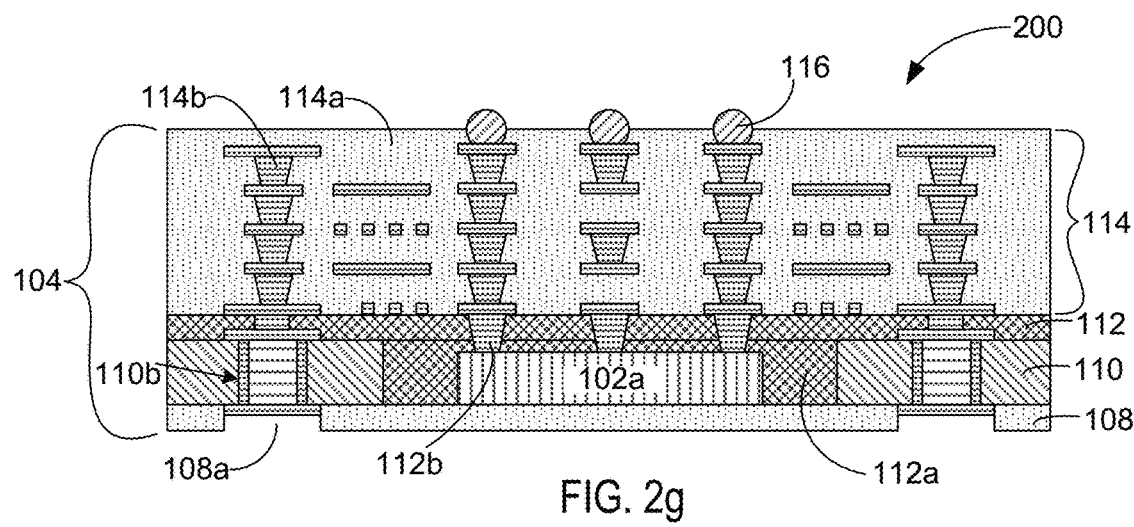

FIG. 2g depicts the package assembly 200 subsequent to depositing solderable material 116 into the openings 114c using any suitable technique. The solderable material 116 may include, for example, solder bumps for die attachment. In other embodiments, the solderable material 116 may be deposited on a surface of the die to be attached to the package assembly 200.

Figure 2H:
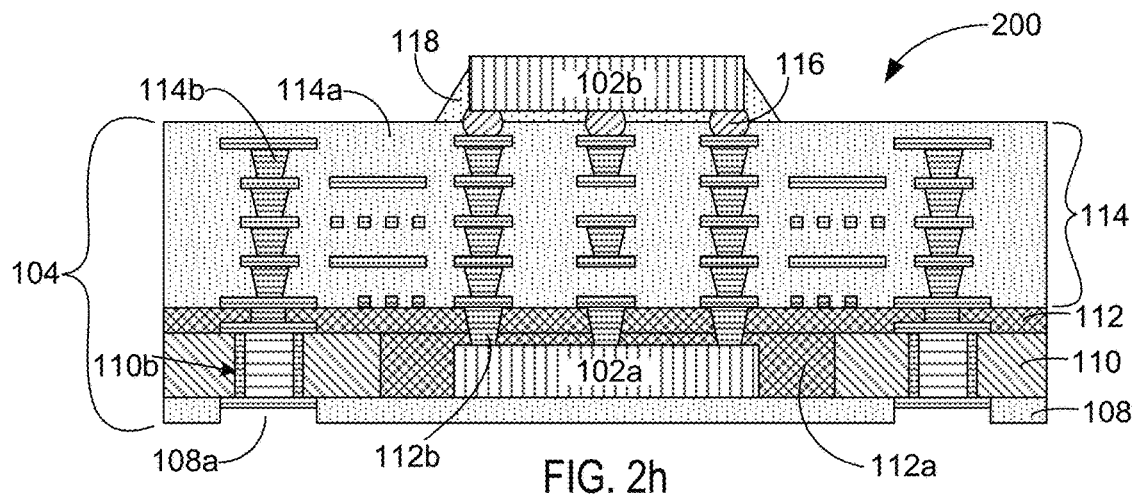

FIG. 2h depicts the package assembly 200 subsequent to attaching the die 102b to the package assembly 200. For example, the die 102b may be coupled with the conductive features 114b of the build-up layers 114 using a flip-chip solder reflow process. In some embodiments, underfill material 118 may be deposited in a region between the die 102b and the package substrate 104.

Figure 3:
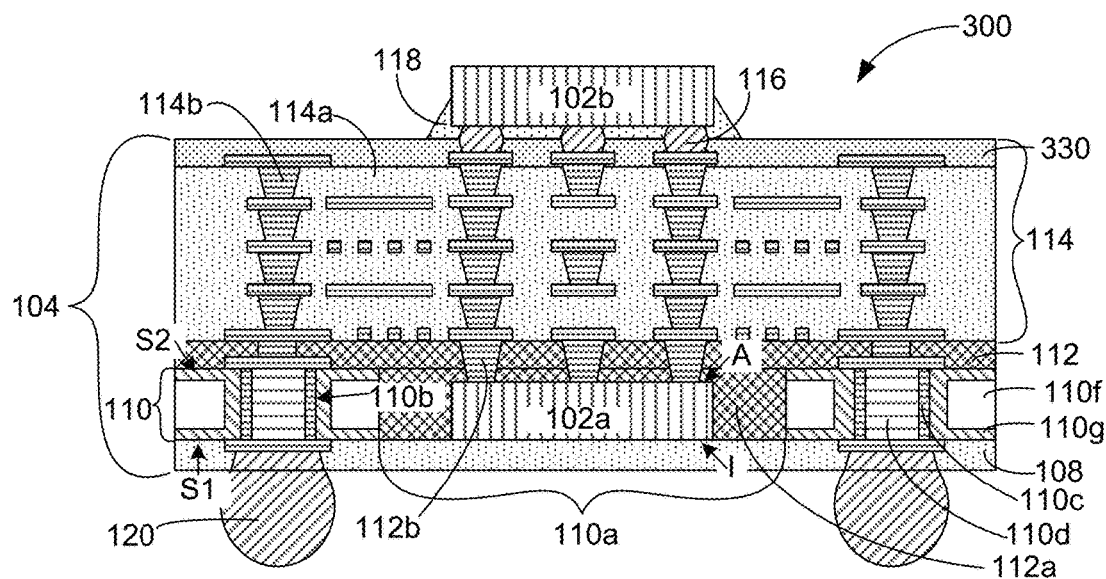
FIG. 3 schematically illustrates a cross-section side view of another example IC package assembly, in accordance with some embodiments.

FIG. 3 schematically illustrates a cross-section side view of another example IC package assembly (hereinafter "package assembly 300"), in accordance with some embodiments. The package assembly 300 may comport with embodiments described in connection with package assembly 100 or 200, except that the reinforced plate 110 of the package assembly 300 of FIG. 3 includes an electrically conductive core 110f such as a metal (e.g., aluminum or copper) and an electrically insulative layer 110g disposed on the core 110f to provide a barrier between material of the core 110f and interconnects (e.g., PTHs 110b) that are disposed in the reinforced plate 110 to prevent shorts and/or leakage. The core 110*f* may include a material that reduces CTE mismatch between materials (e.g., materials of the die 102*a*) of the package assembly 300 during thermal processes and/or a material that has higher thermal conductivity to facilitate heat removal away from the die 102*a*.

The package assembly 300 may further include a solder resist layer 330 formed on the build-up layers 114 and the die 102*b* may be coupled with the conductive features 114*b* of the build-up layers 114 through the solder resist layer 330. Although not shown, a solder resist layer 330 may be formed on the die attach layer 108 in some embodiments.

Figure 4:
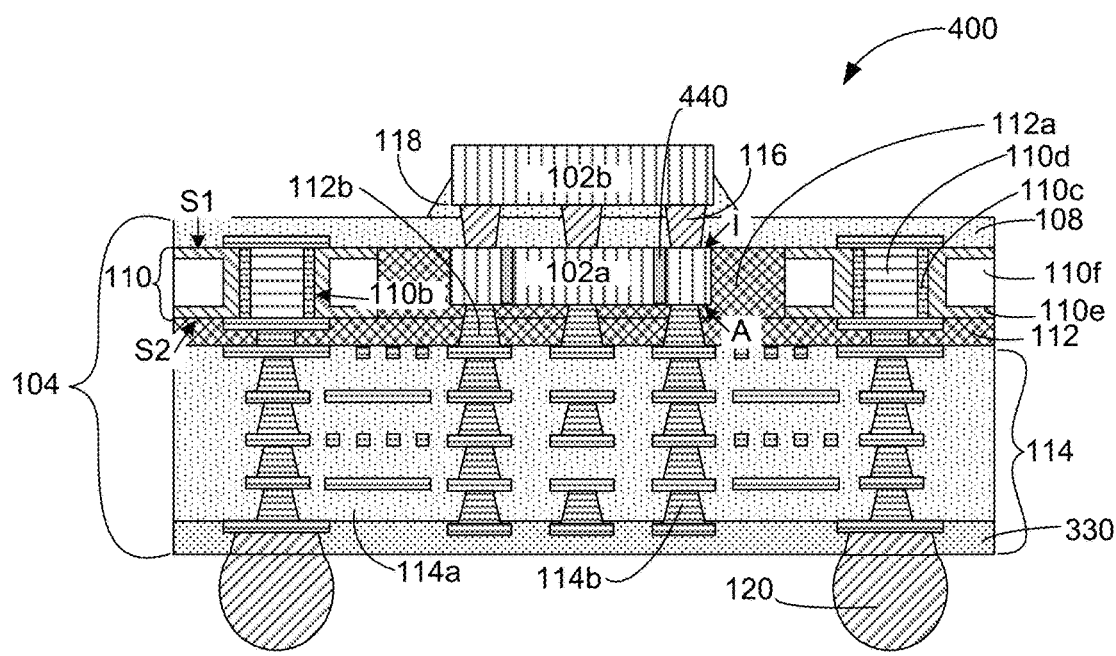
FIG. 4 schematically illustrates a cross-section side view of yet another example IC package assembly, in accordance with some embodiments.

FIG. 4 schematically illustrates a cross-section side view of yet another example IC package assembly (hereinafter "package assembly 400"), in accordance with some embodiments. In some embodiments, the die 102*b* may be coupled with an inactive side I of the die 102*a*, as can be seen. In the depicted embodiment, the die 102*b* is coupled with the die 102*a* using solderable material 116 (e.g., or other suitable FLIs) that extends through the die attach layer 108. In some embodiments, the die 102*a* includes one or more through-silicon vias (TSVs) 440 disposed between the active side A and the inactive side I to route electrical signals through the die 102*a*. The interconnects (e.g., solderable material 116) of the die 102*b* may be electrically coupled with the TSVs 440. In some embodiments, electrical signals between the dies 102*a* and 102*b* may be routed over the TSVs 440.

Figure 5:
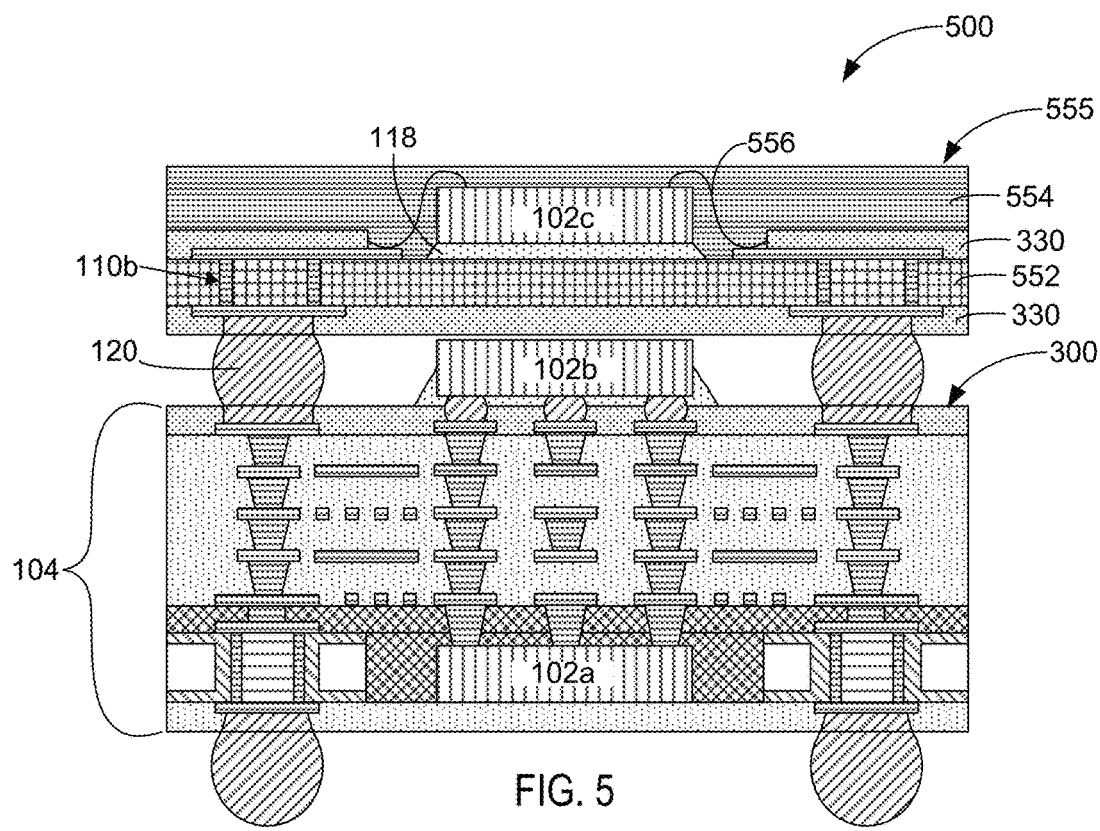
FIG. 5 schematically illustrates a cross-section side view of still yet another example IC package assembly, in accordance with some embodiments.

FIG. 5 schematically illustrates a cross-section side view of still yet another example IC package assembly (hereinafter "package assembly 500"), in accordance with some embodiments. The package assembly 500 depicts an example PoP configuration.

In the package assembly 500, a package substrate 555 including a die 102*c* is coupled with the package substrate 104 of package assembly 300 using package-level interconnects such as, for example, solder balls 120. In the depicted embodiment, the package substrate 555 includes die 102*c* mounted on a laminate 552 using, for example, an adhesive such as underfill material 118. In the depicted embodiment, the die 102*c* is coupled with the laminate 552 in a wire-bonding configuration using one or more bonding wires 556. The die 102*b* is disposed between the package substrate 555 and the package substrate 104.

The package substrate 555 may include electrical routing features such as, for example, PTHs 110*b* coupled with the die 102*c* through the bonding wires 556. The electrical routing features of the package substrate 555 may route electrical signals of the die 102*c* to or from package-level interconnects such as solder balls 120. Other suitable techniques to couple the die 102*c* with the package substrate 555 can be used in other embodiments including, for example, flip-chip configurations, embedding techniques, etc.

A solder resist layer 330 may be formed on opposing sides of the laminate 552. In some embodiments, a molding compound 554 may be formed to encapsulate the die 102*c*. According to various embodiments, the underfill material 118, the molding compound 554 and/or the solder resist layer 330 may be composed of an epoxy resin and the laminate 552 may be a copper clad laminate (CCL) composed of an epoxy resin with glass cloth. Other suitable materials may be used in other embodiments. The package substrate 555 may include a wide variety of other suitable configurations in other embodiments. In some embodiments, the package substrate 555 may include any suitable electrical routing features to couple die 102*c* with electrical routing features of the package substrate 104.

Figure 6:
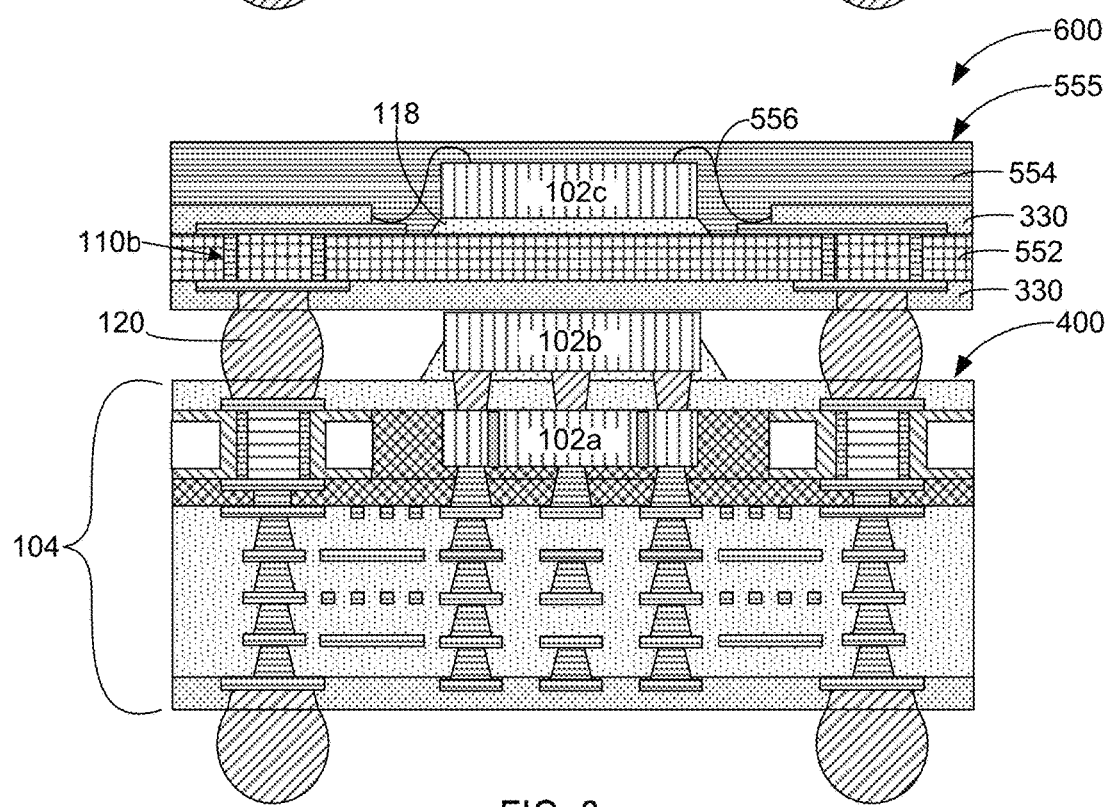
FIG. 6 schematically illustrates a cross-section side view of still yet another example IC package assembly, in accordance with some embodiments.

FIG. 6 schematically illustrates a cross-section side view of still yet another example IC package assembly (hereinafter "package assembly 600"), in accordance with some embodiments. The package assembly 600 depicts another PoP assembly. In the package assembly 600, a package substrate 555 including a die 102*c* is coupled with the package substrate 104 of package assembly 400 using package-level interconnects such as, for example, solder balls 120. The die 102*c* of package assembly 500 or 600 may configured to communicate with the dies 102*a* and/or 102*b* and/or a circuit board through the package-level interconnects (e.g., solder balls 120) that couple the package substrate 555 with package substrate 104.

Figure 7:
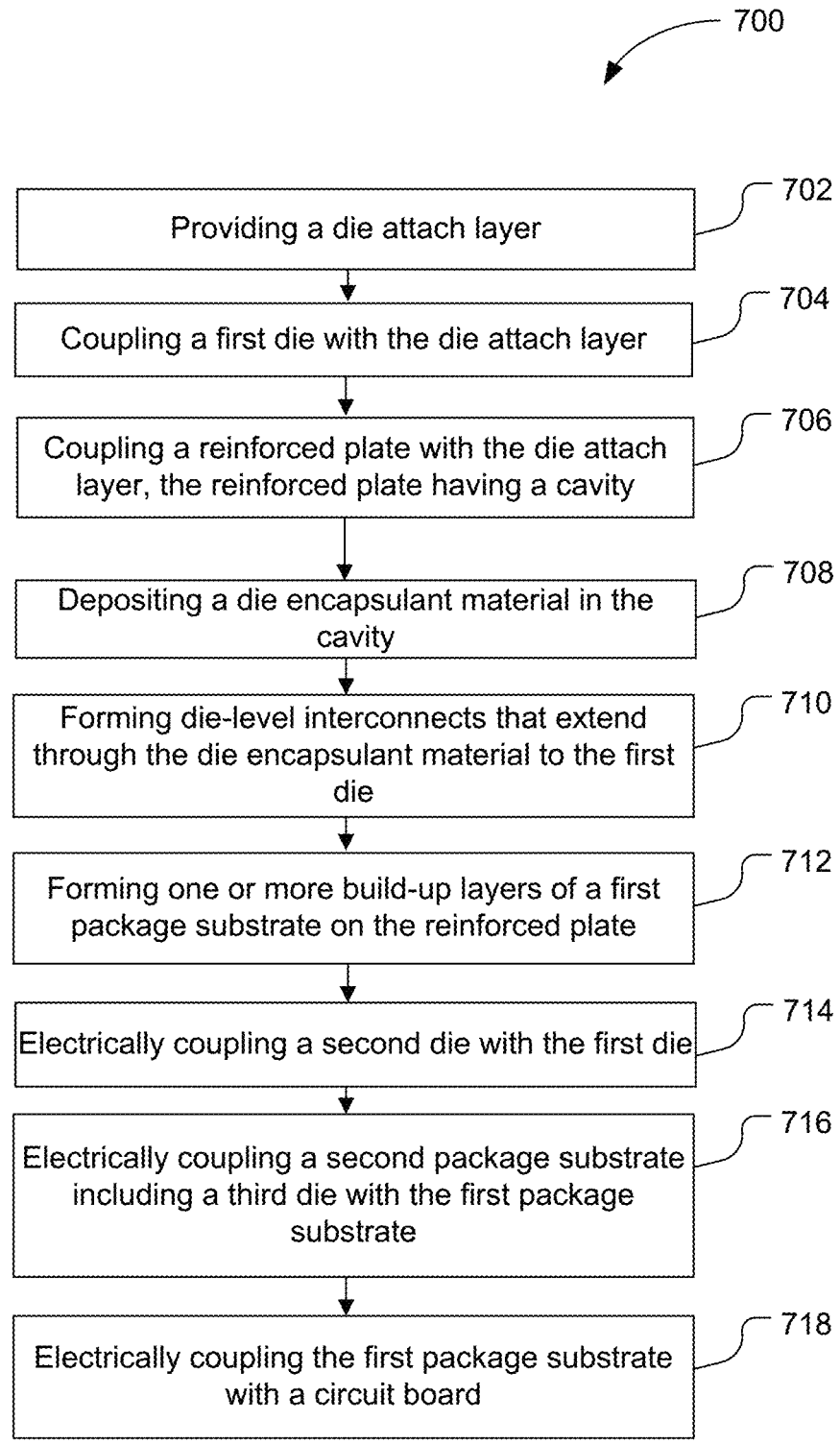
FIG. 7 schematically illustrates a flow diagram for a method of fabricating an IC package assembly, in accordance with some embodiments.

FIG. 7 schematically illustrates a flow diagram for a method 700 of fabricating an IC package assembly, in accordance with some embodiments. The method 700 may comport with techniques and/or configurations described in connection with FIGS. 1-6 and vice versa.

At 702, the method 700 may include providing a die attach layer (e.g., die attach layer 108 of FIG. 2*a*). At 704, the method 700 may include coupling a first die (e.g., die 102*a* of FIG. 2*b*) with the die attach layer. At 706, the method 700 may include coupling a reinforced plate (e.g., reinforced plate 110 of FIG. 2*b*) with the die attach layer, the reinforced plate having a cavity. According to various embodiments, actions at 704 and 706 may be simultaneously performed during a same operation (e.g., hot pressing and/or curing process).

At 708, the method 700 may include depositing a die encapsulant material (e.g., die encapsulant material 112*a* of FIG. 2*d*) in the cavity. In some embodiments, depositing the die encapsulant material in the cavity may be performed by applying a laminate layer (e.g., laminate layer 112 of FIG. 2*c*) on the reinforced plate and hot pressing the laminate layer to couple the laminate layer with the reinforced plate and substantially fill the cavity with material of the laminate layer.

At 710, the method 700 may include forming die-level interconnects (e.g., FLIs) that extend through the die encapsulant material to the first die. The die-level interconnects may include, for example, via structures (e.g., via structures 112*b* of FIG. 2*e*) formed using a laser drilling technique. The die-level interconnects may include other suitable structures in other embodiments.

At 712, the method 700 may include forming one or more build-up layers (e.g., build-up layers 114 of FIG. 2*e*) of a first package substrate (e.g., package substrate 104 of FIG. 2*e*) on the reinforced plate. In some embodiments, the first die is electrically coupled with electrical routing features (e.g., conductive features 114*b* of FIG. 2*e*) of the one or more build-up layers through the die-level interconnects subsequent to forming the one or more build-up layers.

At 714, the method 700 may include electrically coupling a second die (e.g., die 102*b* of FIG. 2*h*) with the first die. In some embodiments, the second die is electrically coupled with the first die through the electrical routing features of the one or more build-up layers (e.g., package assembly 300 of FIG. 3). In other embodiments, the second die is coupled with an inactive side of the first die (e.g., package assembly 400 of FIG. 4). For example, the first die may include TSVs and the second die may be electrically coupled with the TSVs through the inactive side of the first die using interconnects that extend through the die attach layer.

At 716, the method 700 may include electrically coupling a second package substrate (e.g., package substrate 555 of FIGS. 5-6) including a third die (e.g., die 102*c* of FIGS. 5-6) with the first package substrate (e.g., package substrate 104 of FIGS. 5-6). The second package substrate may be coupled with either one of two opposing sides of the first package substrate as depicted, for example, in connection with FIGS. 5-6 using package-level interconnects such as solder balls 120.

At 718, the method 700 may include electrically coupling the first package substrate with a circuit board (e.g., circuit board 106 of FIG. 1). In some embodiments, package-level interconnects such as solder balls may be coupled with either one of the two opposing sides of the first package substrate to route electrical signals between the dies (e.g., first die and second die) of the first package substrate and the circuit board. In embodiments where the second package substrate is coupled with the first package substrate, the package-level interconnects formed at 718 may be further configured to route electrical signals between dies (e.g., third die) of the second package substrate and the circuit board.

Various operations are described as multiple discrete operations in turn, in a manner that is most helpful in understanding the claimed subject matter. However, the order of description should not be construed as to imply that these operations are necessarily order dependent. For example, actions of the method 700 may be performed in another suitable order than depicted.

Figure 8:
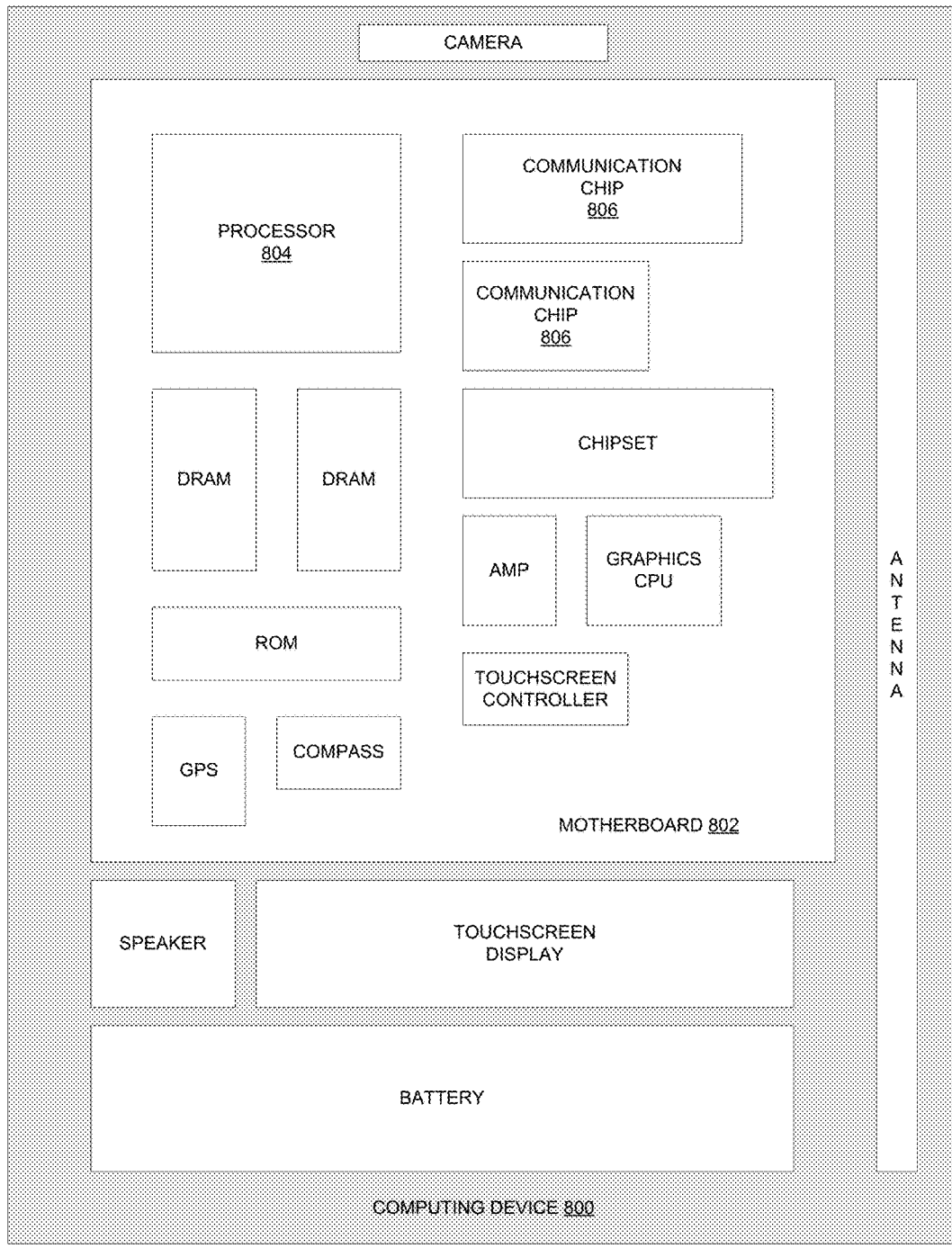
FIG. 8 schematically illustrates a computing device that includes an IC package assembly as described herein, in accordance with some embodiments.

Embodiments of the present disclosure may be implemented into a system using any suitable hardware and/or software to configure as desired FIG. 8 schematically illustrates a computing device 800 that includes an IC package assembly as described herein, in accordance with some embodiments. The computing device 800 may house a board such as motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 may be packaged in an IC assembly (e.g., package assembly 100 of FIG. 1) as described herein. For example, referring to FIGS. 1 and 8, the circuit board 106 of FIG. 1 may be a motherboard 802 and the processor 804 may be a die 102a or 102b packaged in a package substrate 104. The package substrate 104 and the motherboard 802 may be coupled together using package-level interconnect structures (e.g., solder balls 120). The term "processor" may refer to any device or portion of a device that processes electronic data from registers and/or memory to transform that electronic data into other electronic data that may be stored in registers and/or memory.

The communication chip 806 may also include a die (e.g., die 102a or 102b of FIG. 1) that may be packaged in an IC assembly (e.g., package assembly 100 of FIG. 1) as described herein. In further implementations, another component (e.g., memory device or other integrated circuit device) housed within the computing device 800 may include a die (e.g., die 102a or 102b of FIG. 1) that may be packaged in an IC assembly (e.g., package assembly 100 of FIG. 1) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an embodiment, the computing device 800 may be a mobile computing device. In further implementations, the computing device 800 may be any other electronic device that processes data.

EXAMPLES

According to various embodiments, the present disclosure describes an apparatus (e.g., package assembly) comprising a die attach layer, a die coupled with the die attach layer, the die having an active side including active devices of the die and an inactive side disposed opposite to the active side, a reinforced plate coupled with the die attach layer, the reinforced plate having a first side and a second side disposed opposite to the first side and a cavity disposed in the reinforced plate and one or more build-up layers coupled with the second side of the reinforced plate, the one or more build-up layers including an insulator and conductive features disposed in the insulator, the conductive features being electrically coupled with the die, wherein the inactive side of the die is in direct contact with the die attach layer, the first side of the reinforced plate is in direct contact with the die attach layer and the die is disposed in the cavity. In some embodiments, the apparatus may further include a die encapsulant material disposed in the cavity and at least partially encapsulating the active side of the die, wherein the die is electrically coupled with the electrical routing features of the one or more build-up layers through via structures that extend through the die encapsulant material. In some embodiments, the die encapsulant material includes prepreg material of a laminate layer disposed between the one or more build-up layers and the reinforced plate, the laminate layer being in direct contact with the second side of the reinforced plate and the die has a thickness that is less than a thickness of the reinforced plate as measured from the first side to the second side of the reinforced plate.

In some embodiments, the die is a first die, and the apparatus further include a second die electrically coupled with the first die. In some embodiments, the second die is electrically coupled with the first die through the electrical routing features of the one or more build-up layers and the reinforced plate includes plated through holes (PTHs) configured to route electrical signals of the first die and the second die to package-level interconnects coupled with the PTHs through the die attach layer. In some embodiments, the one or more build-up layers, the reinforced plate and the die attach layer are part of a first package substrate and the package-level interconnects are first package-level interconnects configured to couple the first package substrate with a circuit board. In some embodiments, the apparatus further includes a second package substrate coupled with the first package substrate using second package-level interconnects and a third die mounted on or embedded in the second package substrate, the third die being electrically coupled with first package substrate through the second package-level interconnects, wherein the second die is disposed between the first package substrate and the second package substrate.

In some embodiments, the first die includes through silicon vias (TSVs) disposed between the active side and the inactive side of the first die and the second die is electrically coupled with the TSVs through the inactive side of the first die using interconnects that extend through the die attach layer. In some embodiments, the one or more build-up layers, the reinforced plate and the die attach layer are part of a first package substrate and the apparatus further includes first package package-level interconnects configured to couple the first package substrate with a circuit board a second package substrate coupled with the first package substrate using second package-level interconnects that are configured to route electrical signals between the first package substrate and the second package substrate through the die attach layer and a third die mounted on or embedded in the second package substrate, the third die being electrically coupled with first package substrate through the second package-level interconnects. In some embodiments, the one or more build-up layers are composed of an epoxy material and the reinforced plate is composed of an epoxy material with glass cloth. In some embodiments, the reinforced plate includes interconnects configured to electrically couple the first side and the second side of the reinforced plate and the reinforced plate is composed of a metal core with an electrically insulative layer disposed on the metal core to electrically insulate the metal core from the interconnects of the reinforced plate.

According to various embodiments, the present disclosure describes a method of fabricating a package assembly, the method including providing a die attach layer, coupling a die with the die attach layer, the die having an active side including active devices of the die and an inactive side disposed opposite to the active side, coupling a reinforced plate with the die attach layer, the reinforced plate having a first side and a second side disposed opposite to the first side and a cavity disposed in the reinforced plate and forming one or more build-up layers on the second side of the reinforced plate, the one or more build-up layers including an insulator and conductive features disposed in the insulator, the conductive features being electrically coupled with the die, wherein the inactive side of the die is in direct contact with the die attach layer, the first side of the reinforced plate is in direct contact with the die attach layer and the die is disposed in the cavity. In some embodiments, the method further includes, prior to forming the one or more build-up layers, depositing a die encapsulant material in the cavity and at least partially encapsulating the active side of the die and forming via structures that extend through the die encapsulant material using a laser drilling process, wherein the die is electrically coupled with the electrical routing features of the one or more build-up layers through the via structures subsequent to forming the one or more build-up layers. In some embodiments, depositing the die encapsulant material comprises applying a laminate layer on the second side of the reinforced plate and hot pressing the laminate layer to couple the laminate layer with the reinforced plate and substantially fill the cavity with prepreg material of the laminate layer.

In some embodiments, the die is a first die and the method further includes electrically coupling a second die with the first die. In some embodiments, electrically coupling the second die with the first die comprises electrically coupling the second die with the first die through the electrical routing features of the one or more build-up layers. In some embodiments, the method further includes forming package-level interconnects that are electrically coupled with the first die and the second die through the die attach layer and through plated through holes (PTHs) disposed in the reinforced plate, the PTHs configured to route electrical signals of the first die and the second die to the package-level interconnects. In some embodiments, the one or more build-up layers, the reinforced plate and the die attach layer are part of a first package substrate and the package-level interconnects are first package-level interconnects configured to couple the first package substrate with a circuit board. In some embodiments, the method further includes coupling a second package substrate with the first package substrate using second package-level interconnects, the second package substrate including a third die mounted on or embedded in the second package substrate, the third die being electrically coupled with first package substrate through the second package-level interconnects, wherein the second die is disposed between the first package substrate and the second package substrate.

In some embodiments, the first die includes through silicon vias (TSVs) disposed between the active side and the inactive side of the first die. In some embodiments, electrically coupling the second die with the first die comprises electrically coupling the second die with the TSVs through the inactive side of the first die using interconnects that extend through the die attach layer. In some embodiments, the one or more build-up layers, the reinforced plate and the die attach layer are part of a first package substrate. In some embodiments, the method further includes forming first package package-level interconnects that are configured to couple the first package substrate with a circuit board and coupling a second package substrate with the first package substrate using second package-level interconnects that are configured to route electrical signals between the first package substrate and the second package substrate through the die attach layer, the second package substrate including a third die mounted on or embedded in the second package substrate, the third die being electrically coupled with first package substrate through the second package-level interconnects. In some embodiments, providing a die attach layer comprises providing a B-stage resin on a panel and coupling a die with the die attach layer and coupling a reinforced plate with the die attach layer are simultaneously performed using a hot press process to attach the die and reinforced plate with the B-stage resin.

According to various embodiments, the present disclosure describes a system (e.g., a computing device) including a circuit board and a package assembly coupled with the circuit board, the package assembly comprising a die attach layer, a die coupled with the die attach layer, the die having an active side including active devices of the die and an inactive side disposed opposite to the active side, a reinforced plate coupled with the die attach layer, the reinforced plate having a first side and a second side disposed opposite to the first side and a cavity disposed in the reinforced plate and one or more build-up layers coupled with the second side of the reinforced plate, the one or more build-up layers including an insulator and conductive features disposed in the insulator, the conductive features being electrically coupled with the die, wherein the inactive side of the die is in direct contact with the die attach layer, the first side of the reinforced plate is in direct contact with the die attach layer and the die is disposed in the cavity. In some embodiments, the circuit board is coupled with the package assembly using package-level interconnects that extend through the die attach layer. In some embodiments, the system is a mobile computing device further comprising one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method of fabricating a package assembly, the method comprising:
   providing a die attach layer having a first side and a second side, wherein the die attach layer is an electrically insulative material, wherein the second side of the die attach layer is exposed to couple with an electrical component by one or more package-level interconnects;
   coupling a die with the die attach layer, the die having an active side including active devices of the die and an inactive side disposed opposite to the active side, the inactive side of the die coupled to the first side of the die attach layer, wherein the die attach layer is used as a substrate for attachment of the die and the die is in direct contact with the die attach layer;
   coupling a reinforced plate with the die attach layer, the reinforced plate having an electrically conductive core, a first side and a second side disposed opposite to the first side and a cavity disposed in the reinforced plate, the first side of the reinforced plate coupled with the first side of the die attach layer and the die is disposed in the cavity; and
   forming one or more build-up layers on the second side of the reinforced plate, the one or more build-up layers including an insulator and conductive features disposed in the insulator, the conductive features being electrically coupled with the die, wherein the inactive side of the die is in direct contact with the die attach layer, the first side of the reinforced plate is in direct contact with the die attach layer and the die is disposed in the cavity.

2. The method of claim 1, further comprising:
   prior to forming the one or more build-up layers, depositing a die encapsulant material in the cavity and at least partially encapsulating the active side of the die; and
   forming via structures that extend through the die encapsulant material using a laser drilling process, wherein the die is electrically coupled with electrical routing features of the one or more build-up layers through the via structures subsequent to forming the one or more build-up layers.

3. The method of claim 2, wherein depositing the die encapsulant material comprises:
   applying a laminate layer on the second side of the reinforced plate; and
   hot pressing the laminate layer to couple the laminate layer with the reinforced plate and substantially fill the cavity with prepreg material of the laminate layer.

4. The method of claim 1, wherein the die is a first die, the method further comprising electrically coupling a second die with the first die.

5. The method of claim 4, wherein electrically coupling the second die with the first die comprises electrically coupling the second die with the first die through the electrical routing features of the one or more build-up layers, the method further comprising:
    forming package-level interconnects that are electrically coupled with the first die and the second die through the die attach layer and through plated through holes (PTHs) disposed in the reinforced plate, the PTHs configured to route electrical signals of the first die and the second die to the package-level interconnects.

6. The method of claim 5, wherein the one or more build-up layers, the reinforced plate and the die attach layer are part of a first package substrate and the package-level interconnects are first package-level interconnects configured to couple the first package substrate with a circuit board, the method further comprising:
    coupling a second package substrate with the first package substrate using second package-level interconnects, the second package substrate including a third die mounted on or embedded in the second package substrate, the third die being electrically coupled with the first package substrate through the second package-level interconnects, wherein the second die is disposed between the first package substrate and the second package substrate.

7. The method of claim 4, wherein:
    the first die includes through silicon vias (TSVs) disposed between the active side and the inactive side of the first die; and
    electrically coupling the second die with the first die comprises electrically coupling the second die with the TSVs through the inactive side of the first die using interconnects that extend through the die attach layer.

8. The method of claim 7, wherein the one or more build-up layers, the reinforced plate and the die attach layer are part of a first package substrate, the method further comprising:
    forming first package-level interconnects that are configured to couple the first package substrate with a circuit board; and
    coupling a second package substrate with the first package substrate using second package-level interconnects that are configured to route electrical signals between the first package substrate and the second package substrate through the die attach layer, the second package substrate including a third die mounted on or embedded in the second package substrate, the third die being electrically coupled with the first package substrate through the second package-level interconnects.

9. The method of claim 1, wherein:
    providing a die attach layer comprises providing a B-stage resin on a panel; and
    coupling a die with the die attach layer and coupling a reinforced plate with the die attach layer are simultaneously performed using a hot press process to attach the die and reinforced plate with the B-stage resin.

10. The method of claim 1, wherein providing the die attach layer includes providing openings in the die attach layer to expose interconnects of the first side of the reinforced plate to couple with the one or more package-level interconnects through the openings of the die attach layer.

* * * * *